United States Patent [19]

Brust et al.

[11] Patent Number: 4,812,748
[45] Date of Patent: Mar. 14, 1989

[54] METHOD AND APPARATUS FOR OPERATING A SCANNING MICROSCOPE

[75] Inventors: Hans-Detlef Brust, Dudweiler; Johann Otto, Bad Toelz, both of Fed. Rep. of Germany

[73] Assignee: Siemens Aktiengesellschaft, Berlin and Munich, Fed. Rep. of Germany

[21] Appl. No.: 900,801

[22] Filed: Aug. 27, 1986

[30] Foreign Application Priority Data

Aug. 30, 1985 [DE] Fed. Rep. of Germany ....... 3531129

[51] Int. Cl.$^4$ .................... G01R 31/28; G01R 31/26
[52] U.S. Cl. ............................ 324/158 R; 324/73 R
[58] Field of Search .......... 324/73 R, 73 PC, 73 AT, 324/158 R, 158 D, 71.3; 250/310, 311

[56] References Cited

U.S. PATENT DOCUMENTS

| | | | |
|---|---|---|---|
| 4,108,358 | 8/1978 | Niemaszyk et al. | 324/73 AT |
| 4,169,244 | 9/1979 | Plows | 324/73 PC |
| 4,335,457 | 6/1982 | Early | 324/73 R |

OTHER PUBLICATIONS

Nagase, M; "A Device Analysis . . ."; Microelectron Rel.; vol. 20; pp. 717-735; Feb. 1980.
V. Wilke, "Laser Scanning in Microscopy", Proc. of the Intl. Soc. for Optical Eng., (Apr. 19-20, 1983) pp. 164-172.
R. Muüller, "Scanning Laser Microscope for Inspection of . . ." Bd. 13, No. 1, Siemens Forsch. -u. Entwickl. (1984) pp. 9-14.

Primary Examiner—Ernest F. Karlsen
Attorney, Agent, or Firm—Hill, Van Santen, Steadman & Simpson

[57] ABSTRACT

A scanning microscope scans over the surface of a specimen to be tested in point-by-point fashion with a probe. The scan rate of the probe is controlled as dependent on a secondary electrical signal derived from the measuring point of the specimen surface and, thus, serves as a control signal to the output signal of a signal processing unit which is evaluated at a window discriminator or comparator. The output signal is supplied to a voltage controlled oscillator of the scan generator through an adjustable timer element. Simultaneously, the evaluated output signal is used for modulating the intensity of the write beam of a display for controlling the intensity of the probe.

9 Claims, 2 Drawing Sheets

METHOD AND APPARATUS FOR OPERATING A SCANNING MICROSCOPE

BACKGROUND OF THE INVENTION

1. Field of the Invention:

The present invention relates to a method for operating a scanning microscope to scan the surface of a specimen, and to a scanning microscope arrangement to implement such method.

2. Description of the Prior Art:

VLSI (very large scale integrated) circuits are usually checked by computer controlled test installations. Such tests are carried out over relatively long periods of time by the test installations. However, even such long tests are incomplete since errors can only be localized with great difficulty, even though the errors are recognized by analyzing the voltage levels at the outputs of the circuit which are dependent on bit patterns fed into the circuit during the test. Additional measurements, therefore, must be carried out for the inside of the VLSI circuits, particularly during the development phase.

Electron beam measuring methods which are utilized in all areas of development and manufacture of microelectronic components have proven particularly suitable for the internal measurements of VLSI circuits. A modified scanning electron microscope is usually used. However, a large apparatus expenditure is required and, for components having passivation layers, a charging of the specimen surface occurs which deteriorates the precision of the measurements.

In addition to electron beam measuring installations, optical scanning microscopes, and in particular scanning laser microscopes, provide load-free operation and are therefore used for checking VLSI circuits. See, for instance, R. Mueller "Scanning Laser Microscope for Inspection of Microelectronic Devices", volume 13, No. 1, Sicmens Forschungs - und Entwicklungsberichte, pages 9–14 (1984).

The structure and functions of a scanning laser microscope are also described in V. Wilke "Laser Scanning in Microscopy", proceedings of the International Society for Optical Engineering: Advances in Laser Scanning and Recording, April 19–20, 1983, Geneva, Switzerland.

To test a specimen, such as an integrated circuit, a finely focused laser beam of a scanning laser microscope is scanned point-by-point over the specimen so that the interaction of the laser beam with the specimen causes the generation of electron-hole pairs. The photocurrent, which results from the separation of the electron-hole pairs in the region of a pn-junction and which is measurable in an external circuit, is used to modulate the intensity of a write beam of a cathode ray tube which is swept across the picture screen in synchronization with the laser beam. This creates a two-dimensional illustration of the pn-junctions within the circuit.

The possible interactions of the primary beam with the specimen substance can be influenced by the scan rate. To guarantee generation of the desired physical effort by the primary beam at every location of the specimen surface, and to document the physical effect through a photocurrent, it has hitherto been necessary to scan the specimen at a very low scan rate. Particularly since micro-electronic components must be operated at low drive frequencies during testing, extremely long image recording times result.

SUMMARY OF THE PRESENT INVENTION

An object of the present invention is to reduce the image recording times for a specimen using a scanning microscope. A further object is to reliably generate and document an interaction of the primary beam with the specimen at every suitable point on the specimen. Yet another object is to assure that the specimen being tested is operated at the same defined operating status during scanning by the scanning microscope.

These and other objects of the present invention are provided in a method including placing the specimen in a defined operating condition during testing and controlling the scanning of the specimen dependent on an evaluated output signal thereof.

An advantage is realized with the present invention in that specimen dependent image recording times are minimized and the specimen is only specifically driven for the desired interaction. By controlling the intensity of the primary beam, the interaction with the specimen is moreover limited to a defined selectable time interval. A reduced risk of damage to the specimen results and the analysis of the measured signals are facilitated.

Further modifications of the present method include scanning the specimen alternately with a first and second scan rate depending on the occurrence and detection of the properties to be investigated, maintaining the scanning probe at a measuring point on the specimen through a test cycle and scanning portions of the specimen at a second lower scan rate upon receiving properties to be investigated during scanning at a first higher scan rate.

An arrangement is also provided for implementing the method of the present invention wherein a threshold circuit is triggered by output signals from the specimen to control a specimen control. The specimen control changes the modulation of the test probe and changes the scan rate of the probe. The scan direction may be momentarily reversed to rescan portions of the specimen at a lower scan rate upon triggering of the threshold circuit.

DESCRIPTION OF THE PREFERRED EMBODIMENTS

Figure 1:
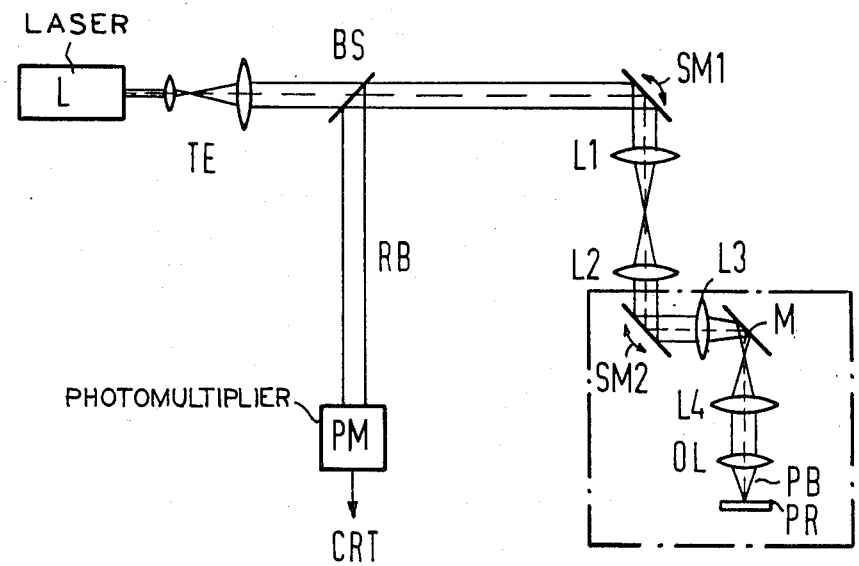
FIG. 1 is a diagram of a scanning laser microscope beam path capable of practicing the steps of the present method.

A beam path of an optical scanning microscope is shown in FIG. 1. The optical scanning microscope has a laser L mostly operating in the visible light wavelength range and used as a high-intensity radiation source. Among other things, the laser L, when used as a light source is distinguished by good focusability, even for long beam paths, due to the high degree of collimation. The beam from the laser L is formed into a fine primary beam PB on a specimen PR to be tested by coupling into an entrance pupil of an objective lens OL through a system of mirrors M, scanners SM1 and SM2, and lens L1, L2, L3 and L4. The beam is first expanded using a telescope TE and is adapted to the diameter of the entrance pupil of the objective lens OL.

Subsequently, the laser beam is transmitted through a scan unit comprising, for example, two ultra-precision mirror galvanometers SM1 and SM2. To guarantee that the objective pupil serves as a pivot point for the laser beam so that the laser beam remains topically at rest in the object pupil, the mirrors SM1 and SM2 of the two galvanometers which oscillate around an orthogonal axis are imaged into the entrance pupil of the objective lens OL with telecentric optics L1–L4. Point-by-point scanning of the specimen PR with the laser beam PB which is reduced in diameter and focused onto the specimen surface by the objective lens OL ensues by a suitable drive of the scan unit SM1 and SM2 through a digital scan generator (not shown).

An image of the specimen is p.g. produced from the radiation reflected from the specimen surface to a detector. To generate an incident light image, radiation backscatter RB which passes through the objective lens OL and out through the scan unit SM1 and SM2 and to a semi-reflecting mirror BS is detected by a photomultiplier PM. The output signal of the photomultiplier PM modulates the intensity of a write beam of a viewing screen CRT which is deflected across the picture screen synchronously with the laser probe PB.

In addition to the use of this conventional optical technique for testing, an optical scanning microscope, as well as a scanning electron microscope, offers possibilities for checking VLSI circuits for functionability or to carry out quality controls. This is e.g. carried out by a method referred to as OBIC (optical beam induced current) or, EBIC (electron beam induced current), which is used to represent the current distribution induced in a circuit with the assistance of a laser probe and, thus, to illustrate the pn-junctions. By using a suitable drive for the circuit, the logic status of the circuit is represented or, alternately, optically invisible surface defects or interruptions can be perceived.

Of particular interest for developers of integrated circuits is testing of CMOS structures with respect to a behavior known as the latch-up effect. The causes of latch-up effect in CMOS circuits are extensively described in the R Mueller publication, and in particular at Section 2 "Investigation of Latch-up Effect", pages 12–14. In normal operation of CMOS circuits, latch-up effects are triggered by thermic generation of electron-hole pairs or by ionizing radiation. The result can be destruction of the component. The weak points of a CMOS circuit, which have a particularly high latch-up sensitivity, are therefore searched out to improve the latch-up sensitivity by redesign.

Testing of a CMOS circuit for latch-up is explained with reference to FIG. 2. The interaction of the primary beam PB with the specimen PR, which is an integrated CMOS circuit operating with nominal frequency, causes triggering of npnp or pnpn structures by generating electron-hole pairs. The interactions can reliably be generated at every point on the specimen and documented using a scanning laser microscope according to the method of the present invention. The apparatus of FIG. 2 also assures that the specimen PR is situated in the same defined operating status at the scan times.

Figure 2:
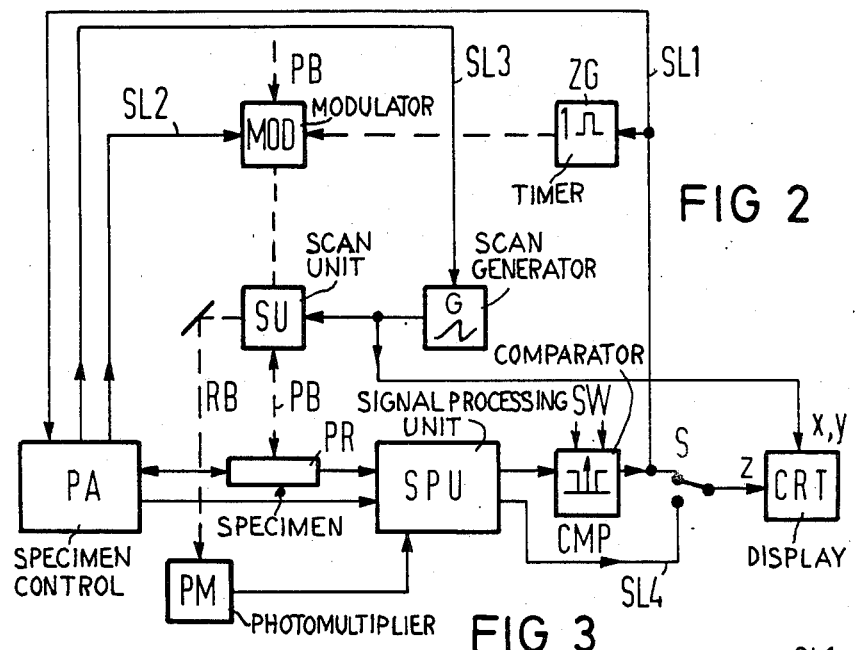
FIG. 2 is a schematic diagram of an arrangement for implementing the method of the present invention.

While the method of the present invention is disclosed with respect to the device shown in FIG. 2, it can also be used anywhere that secondary signals are derived by the interaction of a scanning primary beam during scanning of a specimen and are used to control a scan rate. This is particularly true for the aforementioned OBIC or EBIC testing of micro-electronic components where, for example, the photocurrent measurable at an external circuit is used to control the scan rate.

In FIG. 2, a probe-shaping part of the scanning laser microscope of FIG. 1 is shown in greatly simplified form. The nearly monochromatic radiation beam generated by the laser L is deflected over the surface of a CMOS circuit PR operating with a nominal frequency. The CMOS circuit PR is to be tested for latch-up by deflecting the beam line-by-line across the specimen PR by a scan unit SU. A modulator MOD varies the beam intensity and is disposed in the beam path between the laser L and the scan unit SU. Electron-hole pairs generated at the respective points of incidence by the interactions of the laser beam PB with the semiconductor material are separated in the region of a pn-junction lead causing causing an increase in the supply current and, thus, the measurable current transmitted to the signal processing unit SPU.

In the regions of the semiconductor component PR in which high field strengths or field gradients occur due to the structure or design of the circuit, optically generated charge carrier pairs lead to the ignition of pnpn or npnp structures, respectively, or to the switching of transistors. The triggering of thyristor-like structures leads to a greatly increased current consumption, which results in high localized heating and often destruction of the circuit PR. The localization of such weak points is therefore significant, particularly during development of a CMOS circuit.

Just like switching of a transistor, latch-up effects can be identified by the signal processing unit SPU from increased power consumption. While the appearance of a latch-up as a self-maintaining effect independent of the laser probe PB is only eliminated by reducing the supply voltage below a threshold, a transistor switches back into an inhibit condition upon reduction of beam intensity. Latch-up investigations are generally carried out in a CMOS circuit PR operating at nominal frequency. Test programs are, therefore, run in the circuit PR and are cyclically supplied through a drive PA which also supplies the supply voltages for operation of the circuit PR.

The appearance of a latch-up generally depends on the operating condition of the circuit PR. To guarantee that the CMOS circuit PR being tested is situated in the same defined operating condition during the scan time independently of the scan location on the surface, the specimen control PA does not initiate a scan generator G until at least one cycle or the interesting portion of one cycle of the test program is completed. The scan generator G generates the deflecting voltage for the scan unit SU to position the laser probe PB to the next measuring point through the signal line SL3. At least one cycle, or an interesting portion of a cycle, of the test program is completed. Additionally, it is possible to suppress the laser beam PB or to reduce its intensity during predetermined portions of the program. The signal line SL2 is used to suppress the laser probe PB by means of an enable signal from the specimen control PA to the modulator MOD. It is also possible to reduce the intensity of the probe PB and, thus, to treat the circuit PR gently.

As set forth above, thyristor-like structures in semiconductor components are triggered by optical generation of charge carrier pairs, or transistors can be switched. Both effects lead to a noticeably increased current consumption for the circuit and, thus, to a high output signal at the output of the signal processing unit which is compared and evaluated in a comparator CMP having predetermined thresholds SW. Instead of the comparator CMP, for example, a window discriminator may also be used. The output signal of the comparator CMP is connected through the signal line SL1 for modulating the intensity of the write beam of the display means CRT and is also supplied to an input of the specimen control PA.

When the output signal of the signal processing unit SPU lies below the predetermined threshold level SW, the scan generator G is started through the signal line SL3 by the specimen control PA, which positions the laser probe PB to the next measuring point after the test program is completed. When, by contrast the signal level measured at a point of the circuit PR exceeds the threshold level SW, the laser probe PB remains positioned at the appertaining measuring point until the method steps set out hereinbelow are completed. Only then does the specimen control PA enable the scan generator G to target the next measuring point through the signal line SL3.

The intensity of the laser probe is suppressed or reduced to distinguish between the triggering of thyristor-like structures and the switching of a transistor. An evaluated output signal of the signal processing unit SPU is supplied to the intensity modulator MOD through an adjustable timer element ZG. When the signal processing unit SPU continues to supply an output signal above the threshold SW despite the reduced beam intensity, a latch-up has occurred at the measuring point. The output signal is used to modulate the intensity of the write beam of a display CRT which is swept across the picture screen in synchronization with the laser probe PB.

In order to quench the latch-up of thyristor-like structures which are induced by the laser probe PB, the probe control PA, informed through the signal line SL1, causes a reduction in the supply voltage. After the suppression of the latch-up, the supply voltage is brought back up to the desired level to bring the circuit PR up to operating condition. It is also possible to reduce the intensity of the primary beam PB through the signal line SL2 at this time. Once the circuit PR to be tested is at the desired operating condition, and when at least one cycle or one portion of a cycle of a test program has been completed, the drive PA enables the scan generator G through the control line SL3. The scan generator G positions then the primary beam PB to the next measuring point.

Depending on the evaluated output signal of the signal processing unit, the method steps set out above are again completed or the laser beam PB is immediately positioned to the next measuring point after the conclusion of at least one cycle of the test program. When the image of the circuit PR in the reflected light is recorded during measurement and is simultaneously displayed on the picture screen of the display means CRT, localization of the regions in which latch-ups occur is significantly facilitated. The incident light beam path RB is shown in FIG. 2, as is the control line SL4 of the signal processing unit SPU that is connected to the display means CRT through the switch S.

An advantage is realized in the present method in that only regions of the circuit PR in which latch-ups occur are scanned at a low rate. Uninteresting regions of the specimen are scanned at a higher rate. In comparison to the known scanning arrangements, the image recording time is considerably reduced for a given spatial resolution and sensitivity.

When it is not technically possible to drive the scan generator G through the specimen control PA, it must be assured that the described test cycle has been completed at least once at every measuring point on the specimen surface. The test cycle can include completion of a program loop or a reduction in the beam intensity or, for latch-ups, a reduction in the supply voltage or, respectively, raising the supply voltage to a rated value.

Figure 3:
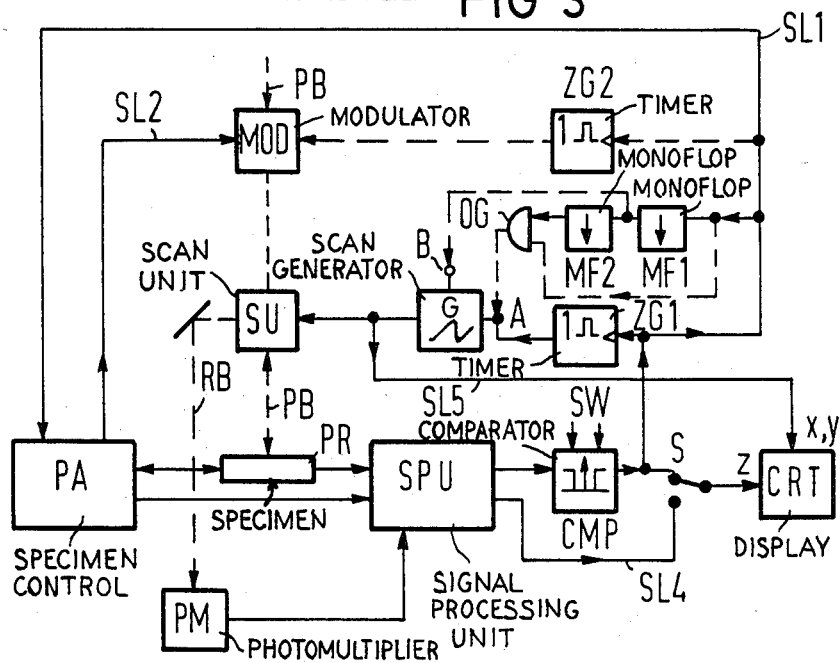
FIG. 3 is a schematic diagram of a second embodiment of the present arrangement.

With reference to FIG. 3, an arrangement of the present invention is shown in which identical reference characters are used to refer to the same elements as in FIG. 2. The embodiment of FIG. 3 differs from the arrangement shown in FIG. 1 in that the control of the dwell time of the laser probe PB at a measuring point and, thus, the resulting scan rate dependent on the observed effect and the test cycle to be executed subsequently thereto does not occur through a signal generated by the specimen control PA, but instead occurs through the evaluated output signal of the signal processing unit SPU which is supplied to a voltage controlled oscillator VCO of the scan generator G via a variable timer element ZG1. As a result, the scan generator G is always switched from a first scan rate to a second lower scan rate when the output signal of the signal processing unit SPU exceeds the threshold level SW prescribed for the comparator CMP, for example, when latch-up occurs.

When, by contrast, the registered output signal for the measuring point lies below the threshold level SW, the scan rate remains unaltered. In the case of increased current consumption of the CMOS circuit PR, the dwell time of the primary beam PB at a measuring point which is dependent on the scan rate must be prescribed for a low second scan rate so that a reliable distinction can be made between the trigger of thyristor-like structures and the switching of transistors. The method steps for documenting latch-up effects have already been described in detail with respect to the arrangement shown in FIG. 2.

To assure that the test cycle defined by the method steps is completed at least once, the dwell time $t^{(2)}{}_{PB}$ for the primary beam PB on an appertaining measuring point should be selected to be greater by at least a factor of two than the time $t_Z$ ($t^{(2)}{}_{PB} \approx 2t_Z$) required for executing the test cycle. A similar condition is true of measuring points at which no increased power consumption is seen. At these points, the dwell time $t^{(1)}$ hd PB as defined by the high scan rate is prescribed such that the test program applied for the circuit PR is completed at least once. The dwell time $t^{(1)}{}_{PB}$ should be selected to be greater by at least a factor of two than the time $t_{TP}$ necessary for completing the test program $t^{(1)}{}_{PB} \approx 2t_{TP}$, for certainty.

Due to the lack of synchronization between the scanning and the drive, longer image recording times are required for the arrangement of FIG. 3. Whereas the change in position of the primary beam PB for the arrangement of FIG. 2 occurs exactly after the expiration of the time $t_Z$ or $t_{TP}$ necessary for executing the test cycle or the test program, the primary beam PB for the arrangement of FIG. 3 must remain positioned at the measuring point for a time longer by about a factor of 2 for the same test cycle or the test program. Despite this limitation, the image recording time remains noticeably lower than that for the known arrangements since the only regions in which the effect to be investigated appears are scanned with a low scan rate.

In accordance with a preferred embodiment of the arrangement as shown in FIG. 3, the evaluated output signal of the signal processing unit SPU is supplied to a first input of an OR gate OG whose output is connected to a control input A of the scan generator G. The evaluated output signal is also supplied to the clock input of a monoflop MF1 whose output is connected to the clock input of a second monoflop MF2. The output of the monoflop MF1 is also connected to the input B of the scan generator G which reverses the moving direction of the laser probe PB over the specimen PR. The output signal of the monoflop MF2 is supplied to a second input of the OR gate OG.

As soon as the output signal of the signal processing unit exceeds the prescribed threshold SW, the monoflop MF1 changes and an output supplied therefrom to the input B of the scan generator G effects a reversal of the scan direction of the laser probe PB. Through the signal line SL5, a reversal of the running direction of the write beam of the display means CRT is also effected.

The extent of the backtrack, or reversal, of the laser probe PB and of the write beam of the CRT is defined by the length of the output signal generated by the monoflop MF1. When the backtrack is undertaken at a first high scan rate, advantages are realized. If warranted, the display means CRT can be blanked during the backtracking. After the conclusion of the backtracking, or reversal, the laser probe PB and the write beam of the display means CRT are again swept in a forward direction. The monoflop MF2 is flipped by the signal edge of the output signal generated by the monoflop MF1 to emit a signal within a time element which is supplied through the OR gate OG to the control input A of the scan generator G. The output signal also switches the latter to the lower second scan rate, even if the output signal of the signal processing unit SP is no longer above the threshold level SW as a consequence of the backtracking.

What can be avoided by this development is that when regions of the CMOS circuit PR in which latch-ups occur are reached, the primary beam PB, as a consequence of the high scan rate, reproduces the limits of these regions only with little precision on the picture screen of the display means CRT.

In a preferred embodiment of the present invention, the output signals of the signal processing unit SPU acquired at individual measuring points during a first fast scan of a large surface region of the circuit PR to be tested are immediately stored, such as in a computer. After the first fast survey, the regions in which an increased power consumption of the circuit PR are identified are again scanned at a second lower scan rate and are represented on the picture screen of the display means CRT.

Figure 4:
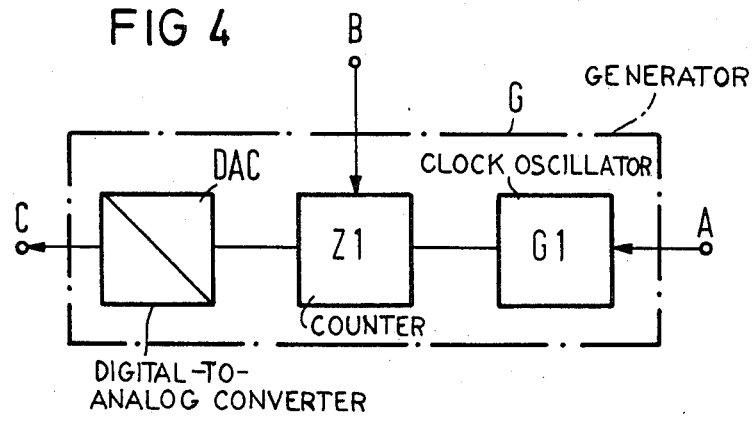
FIG. 4 is a block diagram of a sub-circuit portion of the arrangement shown in FIG. 3.

In FIG. 4, an expedient sub-circuit of the scan generator G is shown. The sub-circuit includes a clock oscillator G1 having a clock frequency influenced by a signal adjustment at an input A. The clock oscillator G1 can be a voltage controlled oscillator VCO. A following counter Z1 counts the pulses emitted by the clock oscillator G1 so that an analog signal corresponding in amplitude to the respective count result is generated by a digital-to-analog convertor DAC. For periodic resetting of the counter Z1 to an initial value, the signal represents a sawtooth-shaped deflection voltage which is output through an output C. For reversing the sweep direction of the primary beam PB on the surface of the specimen, the scan generator G is controlled through an input B with a signal which reverses the counting direction of the counter Z1.

The scan generator G preferably contains a circuit of the type shown in FIG. 4 for generating an X-deflection voltage and for generating a Y-deflection voltage.

It will be understood that variations and modifications may be effected without departing from the spirit and scope of the novel concepts of the present invention.

We claim as our invention:

1. A method for operating a scanning microscope having a probe generated in a probe-shaping portion and capable of being scanned over a specimen using a deflection unit, comprising the steps of:
    establishing a defined operating condition in the specimen for testing;
    scanning the probe point-by-point over regions of a specimen surface to be tested;
    converting the effects triggered by the interaction of the specimen and the probe into electrical signals;
    supplying said electrical signal to an arrangement for signal processing;
    evaluating said electrical signal by said arrangement for signal processing; and
    controlling said scanning step depending on an output signal from said arrangement for signal processing, said step of controlling including:
        scanning at a first scan rate a region of the specimen surface in which an effect characteristic of a property to be investigated does not occur; and
        scanning at a lower second scan rate a region of the specimen in which said effect does occur.

2. A method as claimed in claim 1, further comprising:
    maintaining said probe positioned at a measuring point of the specimen surface until at least one part of a test cycle has been completed for documenting the effect characteristic of the property to be investigated has been completed.

3. A method as claimed in claim 1, further comprising:
    changing the position of said probe from a first point to a second point on the specimen surface only when exactly one part of a test cycle for documenting the effect characteristic of the property to be investigated is over and said specimen is again in the same operating condition.

4. A method as claimed in claim 3, further comprising:
    setting the operating condition of the specimen by the specimen control;
    monitoring the operating condition of the specimen by said specimen control; and
    initiating a change in position of the probe by a signal of said probe control dependent on the evaluated output signal of the signal processing unit.

5. A method as claimed in claim 1, further comprising:
    reversing briefly the direction of motion of the probe swept over the specimen surface with a first scan rate when regions in which an effect to be tested are reached; and
    subsequently sweeping said probe in an original direction of motion with a second lower scan rate.

6. A method as claimed in claim 1, further comprising:
   scanning the specimen surface with said probe with said first scan rate;
   intermediately storing the output signal generated by said signal processing unit during said scanning step from the measuring points of the specimen surface; and
   subsequently scanning at least portions of the specimen surface with said probe swept with a lower second scan rate on the basis of said intermediately stored output signals.

7. A method as claimed in claim 1, wherein said evaluation of said output signals generated by said signal processing unit is undertaken by comparing said output signals to at least one threshold level, dependent upon the properties to be tested.

8. A method as claimed in claim 1, further comprising:
   displaying the output signal from said signal processing unit.

9. A method as claimed in claim 1, further comprising:
   recording the output signal from said signal processing unit.

* * * * *